United States Patent
Zhao et al.

(10) Patent No.: US 8,785,938 B2
(45) Date of Patent: Jul. 22, 2014

(54) METHOD FOR FORMING POLYCRYSTALLINE FILM, POLYCRYSTALLINE FILM AND THIN FILM TRANSISTOR FABRICATED FROM THE POLYCRYSTALLINE FILM

(75) Inventors: Lianfeng Zhao, Beijing (CN); Renrong Liang, Beijing (CN); Mei Zhao, Beijing (CN); Jing Wang, Beijing (CN); Jun Xu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/583,851

(22) PCT Filed: Aug. 2, 2012

(86) PCT No.: PCT/CN2012/079563
§ 371 (c)(1),
(2), (4) Date: Sep. 10, 2012

(87) PCT Pub. No.: WO2013/159468
PCT Pub. Date: Oct. 31, 2013

(65) Prior Publication Data
US 2013/0277677 A1    Oct. 24, 2013

(30) Foreign Application Priority Data
Apr. 23, 2012    (CN) .......................... 2012 1 0120971

(51) Int. Cl.
*H01L 29/786* (2006.01)
*H01L 29/04* (2006.01)

(52) U.S. Cl.
USPC ............................... 257/66; 257/75; 438/486

(58) Field of Classification Search
USPC ............... 257/65, 66, 75, E31.043, E21.572; 438/486
See application file for complete search history.

(56) References Cited

U.S. PATENT DOCUMENTS

| | | |
|---|---|---|
| 5,950,078 A | 9/1999 | Maekawa et al. |
| 2004/0253797 A1 | 12/2004 | Huang et al. |
| 2005/0139919 A1 | 6/2005 | Park et al. |
| 2006/0134894 A1 | 6/2006 | Yin et al. |
| 2007/0065998 A1 | 3/2007 | Lee et al. |
| 2008/0179600 A1* | 7/2008 | Takeguchi ...................... 257/72 |

FOREIGN PATENT DOCUMENTS

CN    1770472 A    5/2006

OTHER PUBLICATIONS

International Search Report and Written Opinion dated Jan. 11, 2013 for corresponding International Application No. PCT/CN2012/079563, filed Aug. 2, 2012.
English Translation of the International Search Report dated Jan. 11, 2013 for corresponding International Application No. PCT/CN2012/079563, filed Aug. 2, 2012.

* cited by examiner

*Primary Examiner* — Whitney T Moore
(74) *Attorney, Agent, or Firm* — David D. Brush; Westman, Champlin & Koehler, P.A.

(57) ABSTRACT

A method for forming a polycrystalline film, a polycrystalline film formed by the method and a thin film transistor fabricated from the polycrystalline film are provided. The method comprises the steps of: providing a substrate; forming a thermal conductor layer on the substrate; etching the thermal conductor layer until the substrate is exposed to form a thermal conductor pattern; forming a seed layer on the thermal conductor layer and the substrate; etching the seed layer to form seed crystals on both sidewalls of the thermal conductor; forming an amorphous layer on the substrate, the thermal conductor layer and the seed crystals; etching the amorphous layer; and recrystallizing the amorphous layer to form a polycrystalline layer.

19 Claims, 3 Drawing Sheets

METHOD FOR FORMING POLYCRYSTALLINE FILM, POLYCRYSTALLINE FILM AND THIN FILM TRANSISTOR FABRICATED FROM THE POLYCRYSTALLINE FILM

CROSS-REFERENCE TO RELATED APPLICATION

This Application is a Section 371 National Stage Application of International Application No. PCT/CN2012/079563, filed Aug. 2, 2012, which claims priority to and benefits of Chinese Patent Application Serial No. 201210120971.0, filed with the State Intellectual Property Office of P. R. China on Apr. 23, 2012, the entire contents of which are incorporated herein by reference.

FIELD

The present disclosure relates to a semiconductor fabrication and design, and more particularly to a method for forming a polycrystalline film, a polycrystalline film formed by the method and a thin film transistor fabricated from the polycrystalline film.

BACKGROUND

Nowadays, thin film transistors have been widely used as pixel switches of a liquid crystal display. Polycrystalline silicon thin film transistors with higher carrier mobility may have a higher potential to monolithically integrate peripheral drive circuits on a display panel. As a key process for a method for fabricating polycrystalline silicon thin film transistors, a process of forming a polycrystalline film is very important. Due to a requirement of a low temperature process, a common method for forming a polycrystalline film comprises steps of: depositing an amorphous silicon film on a host substrate, and then transforming amorphous silicon into polycrystalline silicon by means of an appropriate crystallization process. One important crystallization process is laser recrystallization, which makes a part of the amorphous silicon with a certain thickness melted instantaneously by short-time laser irradiation and then solidified rapidly so as to achieve the purpose of recrystallization. However, disadvantages of the laser recrystallization lie in the fact that, because a nucleation process of a silicon film in a molten state is random during a solidification process, it is hard to control a size of a grain, and it is also hard to precisely control an energy density of a laser because a process window is very narrow.

SUMMARY

The present disclosure is aimed to solve at least one of the above mentioned technical problems. Particularly, a method for forming a polycrystalline film, a polycrystalline film formed by the method and a thin film transistor fabricated from the polycrystalline film are provided.

According to an aspect of the present disclosure, a method for forming a polycrystalline film is provided. The method comprises steps of: providing a substrate; forming a thermal conductor layer on the substrate; etching the thermal conductor layer until the substrate is exposed to form a thermal conductor pattern; forming a seed layer on the thermal conductor layer and the substrate; etching the seed layer to form seed crystals on both sidewalls of the thermal conductor; forming an amorphous layer on the substrate, the thermal conductor layer and the seed crystals; etching the amorphous layer; and recrystallizing the amorphous layer to form a polycrystalline layer.

According to an embodiment of the present disclosure, because of using the thermal conductor, the heat near the seed crystals may firstly dissipate, which may ensure that the amorphous layer in a molten state begins to solidify from the seed crystals. By using the seed crystals, the solidification and crystallization of the amorphous layer may be facilitated, and the randomness of the nucleation may be reduced. Moreover, because a local directional solidification may be formed due to the fact that the heat near the thermal conductor layer dissipates rapidly and preferentially, a size of a grain of the polycrystalline layer may be increased greatly, and a position of the grain may be controlled, and thus a carrier mobility of the polycrystalline thin film transistor may be enhanced and a polycrystalline thin film transistor with high performance may be fabricated. Besides, the seed crystals and the thermal conductor layer in the present disclosure may effectively enlarge a process window of the critical laser energy density in a conventional laser crystallization process.

According to another aspect of the present disclosure, a polycrystalline film is provided. The polycrystalline film comprises: a substrate; a thermal conductor layer formed on the substrate; seed crystals formed on both sidewalls of the thermal conductor layer; and a polycrystalline layer formed on a part of the substrate which is not covered by the thermal conductor layer and the seed crystals.

With the polycrystalline film according to an embodiment of the present disclosure, the size of the grain of the polycrystalline layer and the carrier mobility of the polycrystalline thin film transistor may be enhanced, and the position of the grain may be controlled.

According to yet another aspect of the present disclosure, a thin film transistor is provided. The thin film transistor comprises: a substrate; a polycrystalline layer formed on the substrate; a source and a drain formed in the polycrystalline layer respectively; a gate dielectric layer formed on the polycrystalline layer and a gate formed on the gate dielectric layer; and a source metal layer formed on the source and a drain metal layer formed on the drain.

According to an embodiment of the present disclosure, the thin film transistor is fabricated from the polycrystalline film with big grain size and high mobility, and therefore it may have a high mobility and an enhanced performance.

In one preferred embodiment of the present disclosure, the thermal conductor pattern is a structure of discontinuous strips. During laser irradiation, a size of a laser spot is not bigger than a length of the thermal conductor layer, which is advantageous for the realization of the rapid heat dissipation effect of the thermal conductor.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
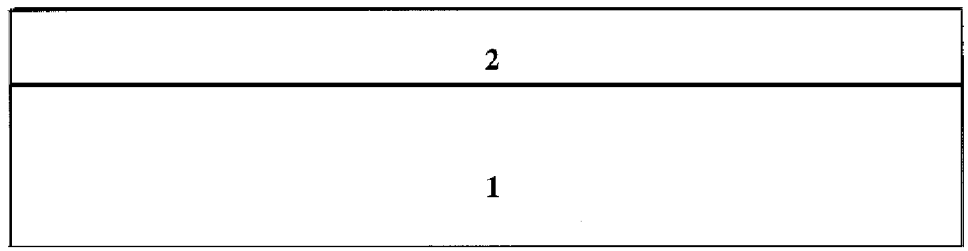
FIGS. 1-7 are cross-sectional views of intermediate statuses of a polycrystalline film formed during a process of a method for forming the polycrystalline film according to a preferred embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

According to an embodiment of the present disclosure, a method for forming a polycrystalline film is provided. The method comprises steps of:

providing a substrate 1;

forming a thermal conductor layer 3 on the substrate 1;

etching the thermal conductor layer 3 until the substrate 1 is exposed to form a thermal conductor pattern;

forming a seed layer 41 on the substrate 1 and the thermal conductor layer 3;

etching the seed layer 41 to form seed crystals 4 on both sidewalls of the thermal conductor layer 3;

forming an amorphous layer 51 on the substrate 1, the thermal conductor layer 3 and the seed crystals 4;

etching the amorphous layer 51; and recrystallizing the amorphous layer 51 to form a polycrystalline layer 5.

A polycrystalline film formed by the method for forming the polycrystalline film according to an embodiment of the present disclosure comprises: a substrate 1; a thermal conductor layer 3 formed on the substrate 1; seed crystals 4 formed on both sidewalls of the thermal conductor layer 3; and a polycrystalline layer 5 formed on a part of the substrate 1 which is not covered by the thermal conductor layer 3 and the seed crystals 4.

The polycrystalline film formed by the method according to an embodiment of the present disclosure may be used to form a thin film transistor. The thin film transistor comprises: a substrate 1; a polycrystalline layer 5 formed on the substrate 1; a source 6 and a drain 7 formed in the polycrystalline layer 5 respectively; a gate dielectric layer 8 formed on the polycrystalline layer 5 and a gate 9 formed on the gate dielectric layer 8; and a source metal layer 10 formed on the source 6 and a drain metal layer 11 formed on the drain 7.

FIGS. 1-7 are cross-sectional views of intermediate statuses of a polycrystalline film formed during a process of a method of forming the polycrystalline film according to a preferred embodiment of the present disclosure, in which the size of each layer is only shown for illustration purpose, which may be designed according to the requirement of device parameters in practice. As shown in the FIGS. 1-7, the method for forming the polycrystalline film according to an embodiment of the present disclosure comprises the following steps.

Step 1, a substrate 1 is provided. The substrate 1 may be any material that may be used to fabricate a thin film transistor, including, but not limited to, glass, plastics and silicon.

Step 2, in this embodiment, as shown in FIG. 1, a passivation layer 2 is formed on the substrate 1, and all the other structures of the polycrystalline film are formed on the passivation layer 2. In other preferred embodiments of the present disclosure, all the other structures of the polycrystalline film are formed directly on the substrate 1. In this embodiment, a material of the passivation layer 2 may include, but is not limited to, an oxide of silicon, silicon nitride, silicon carbide or a combination thereof, and a thickness of the passivation layer 2 is within a range from 10 nm to 50 μm.

Figure 2:
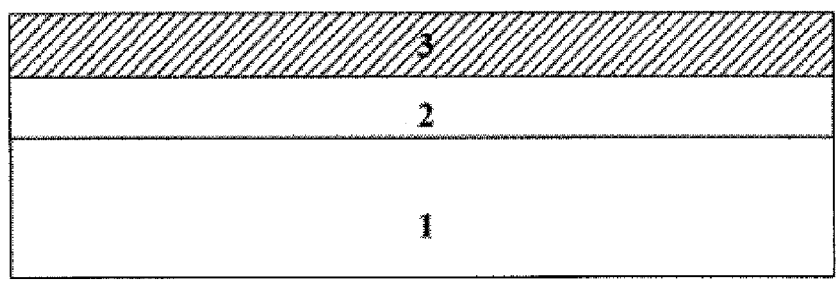

Step 3, as shown in FIG. 2, a thermal conductor layer 3 is formed on the passivation layer 2. A process of forming the thermal conductor layer 3 may include, but is not limited to, physical vapor deposition and chemical vapor deposition. A melting point of a thermal conductor of the thermal conductor layer 3 is higher than a highest temperature of the thermal conductor during laser irradiation, which does not make the thermal conductor melted in the laser crystallization process. A thermal conductivity of the thermal conductor layer 3 is higher than that of the polycrystalline layer. A material of the thermal conductor layer 3 may include, but is not limited to, a metal such as aluminum, tungsten, silver and copper as well as a high temperature-resistant non-metallic material. A thickness of the thermal conductor layer 3 is not less than a thickness of a polycrystalline layer which is expected to grow.

Figure 3:
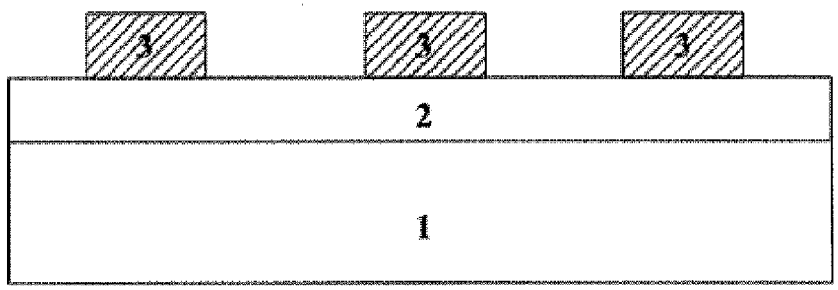

Step 4, as shown in FIG. 3, the thermal conductor layer 3 is etched until the passivation layer 2 is exposed to form a thermal conductor pattern. The process of etching the thermal conductor layer 3 may include, but is not limited to, lithography and etching. The thermal conductor pattern may be any continuous or discontinuous pattern consisting of a polygon, a circle, a line and an arc; or a pattern consisting of an irregular curve. In this embodiment, the thermal conductor pattern is preferably a structure of strips.

Figure 4:
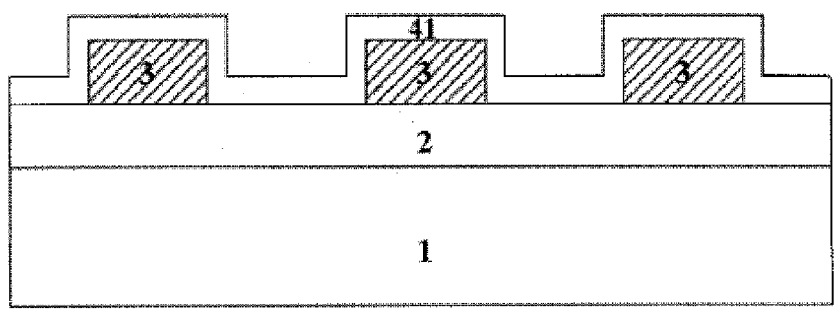

Step 5, as shown in FIG. 4, a seed layer 41 is formed on the thermal conductor layer 3 and the passivation layer 2. The process of forming the seed layer 41 may include, but is not limited to, chemical vapor deposition, physical vapor deposition and atomic layer deposition. The seed layer 41 may be a heterogeneous seed layer or a homogeneous seed layer corresponding to a material of the polycrystalline layer. In some embodiments, a mismatch between a lattice constant of a material of the seed layer 41 and N or 1/N times of the lattice constant of a material of the polycrystalline layer 5 is not more than 30%, in which N is a positive integer. In this embodiment, the seed layer 41 is a heterogeneous seed layer, and a lattice constant of a material of the heterogeneous seed layer is coincident with a lattice constant of a material of the polycrystalline layer within an acceptable mismatch. In one preferred embodiment of the present disclosure, a mismatch between the lattice constant of the material of the heterogeneous seed layer and N times of the lattice constant of the material of the polycrystalline layer 5 is not more than 30%, and in another preferred embodiment of the present disclosure, the mismatch between the lattice constant of the material of the heterogeneous seed layer and 1/N times of the lattice constant of the material of the polycrystalline layer 5 is not more than 30%, in which N is a positive integer. The material of the heterogeneous seed layer may include, but is not limited to, a metal silicide such as $NiSi_2$, a metal germanide, calcium fluoride, cerium oxide and zirconium oxide. A thickness of the heterogeneous seed layer is within a range from 1 nm to 1 μm.

Figure 5:
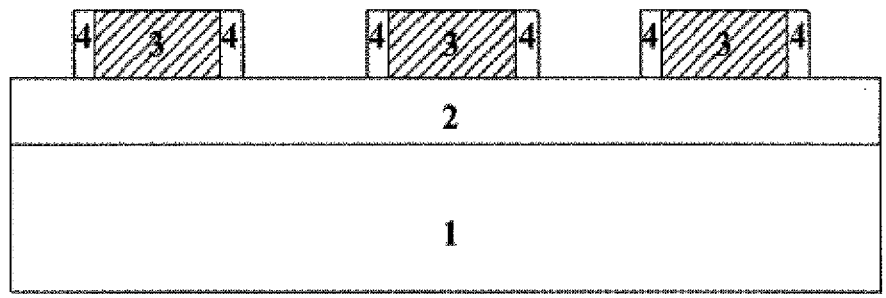

Step 6, as shown in FIG. 5, the seed layer 41 is etched to form seed crystals 4 on both sidewalls of the thermal conductor layer 3. The process of etching the seed layer 41 may include, but is not limited to, lithography and etching. In some embodiments, the seed crystals 4 may be heterogeneous or homogeneous to a material of the polycrystalline layer 5. In some embodiments, a mismatch between a lattice constant of a material of the seed crystals 4 and N or 1/N times of the lattice constant of a material of the polycrystalline layer 5 is not more than 30%, in which N is a positive integer. In some embodiments, a material of the heterogeneous seed crystals is one of a metal silicide, a metal germanide, calcium fluoride, cerium oxide and zirconium oxide. The seed crystals 4 may be poly crystals or single crystals.

Figure 6:
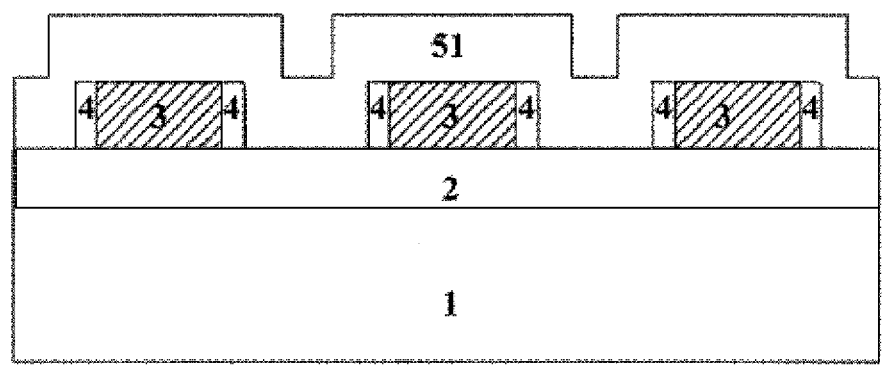

Step 7, as shown in FIG. 6, an amorphous layer 51 is formed on the passivation layer 2, the thermal conductor layer 3 and the seed crystals 4. The process of forming the amorphous layer may include, but is not limited to, chemical vapor deposition.

Figure 7:
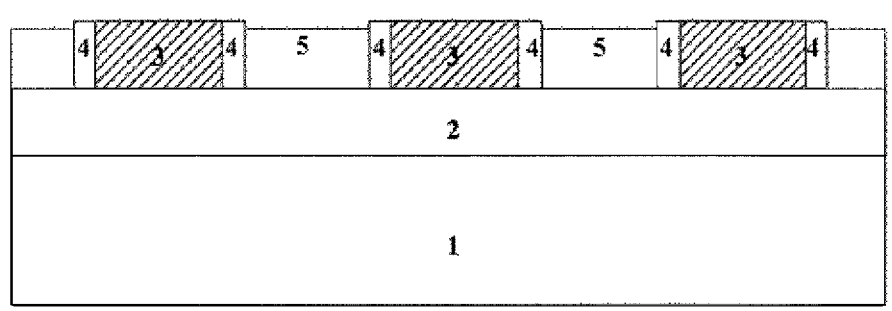

Step 8, as shown in FIG. 7, the amorphous layer 51 is etched to make a thickness of the remaining amorphous layer be within a range from 10 nm to 1000 nm. The process of etching the amorphous layer 51 may include, but is not limited to, chemical mechanical polishing, wet etching and dry etching. In this embodiment, the thickness of the amorphous layer 51 after etched is less than the thickness of the thermal conductor layer 3. In other preferred embodiments, the thickness of the amorphous layer 51 after etched is equal to the thickness of the thermal conductor layer 3.

Figure 8:
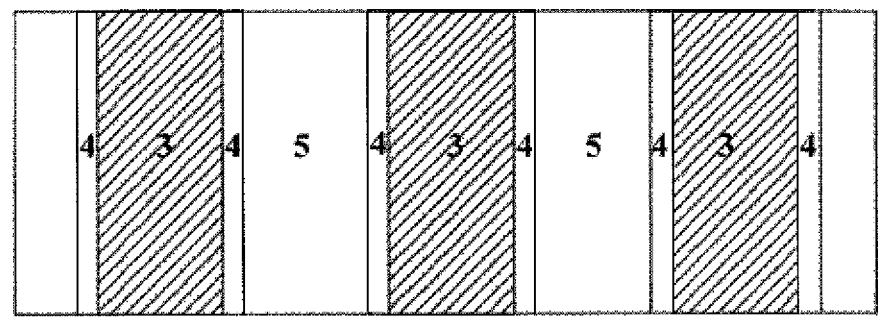
FIG. 8 is a top view of the polycrystalline film shown in FIG. 7.

Step 9, the amorphous layer 51 is recrystallized to form a polycrystalline layer 5. In one embodiment, a thickness of the polycrystalline layer 5 is within a range from 10 nm to 1000 nm. The recrystallization process may be laser irradiation, rapid thermal annealing, or metal-induced crystallization, which makes the amorphous layer 51 melted and then cooled and solidified to transform the amorphous layer 51 into the polycrystalline layer 5. In this embodiment, the laser irradiation is used to make the amorphous layer 51 recrystallized to form the polycrystalline layer 5. The recrystallizing step performed by laser irradiation includes, but is not limited to, a recrystallizing process of melting and solidifying the amorphous layer 51. In this embodiment, a size of a laser spot in the laser irradiation process is not bigger than a length of the thermal conductor layer 3, which is advantageous for the realization of the rapid heat dissipation effect of the thermal conductor. The top view of the polycrystalline film formed by the above method is shown in FIG. 8.

According to an embodiment of the present disclosure, the polycrystalline layer 5 is separated by the thermal conductor layer 3 and the seed crystals 4, which makes the heat near the seed crystals 4 firstly dissipate and thus ensures that the amorphous layer in a molten state begins to solidify from the seed crystals. By using the seed crystals, the solidification and crystallization of the amorphous layer may be facilitated, and the randomness of the nucleation may be reduced. Meanwhile, because the heat near the thermal conductor layer dissipates rapidly, the solidification process after the amorphous layer is melted is local directional solidification, which may increase a size of a grain of the polycrystalline layer and control a position of the grain. Particularly, a size of a grain in a direction vertical to the thermal conductor layer may be very large, and the direction may be used as a channel direction of a transistor, so that a carrier mobility of the polycrystalline thin film transistor may be enhanced greatly and a polycrystalline thin film transistor with high performance may be fabricated. Besides, the seed crystals and the thermal conductor layer in the present disclosure may effectively enlarge a process window of a critical laser energy density in a conventional laser crystallization process.

In other preferred embodiments of the present disclosure, before Step 9, i.e., before the amorphous layer 51 is irradiated by the laser, a dielectric layer transparent to the laser is formed on the amorphous layer 51. The dielectric layer may include, but is not limited to, a $SiO_2$ layer. The process of forming the dielectric layer may include, but is not limited to, chemical vapor deposition. During the laser irradiation, the dielectric layer may increase the melting duration of the amorphous layer 51. After the amorphous layer 51 is recrystallized to form the polycrystalline layer 5, the dielectric layer is removed by etching. The etching process may include, but is not limited to, wet etching.

The method for forming the polycrystalline film according to the present disclosure may be used for, but is not limited to, forming a polycrystalline silicon film and a polycrystalline germanium film. In one preferred embodiment of the present disclosure, the method for forming a polycrystalline silicon film comprises the following steps. First, a silicon nitride passivation layer 2 with a thickness of 500 nm is formed on a single-crystal silicon substrate 1 by chemical vapor deposition. Then, a tungsten layer with a thickness of 100 nm is formed on the silicon nitride passivation layer 2 by sputtering, which is used as a thermal conductor layer 3. Then, the tungsten layer is etched to make the thermal conductor layer 3 have a structure of a strip, a width of the strip is 1 μm, a spacing between strips is 10 μm, and a length of the strip is designed based on the size of the substrate and may be bigger than twice the size of a laser spot. Then, a $NiSi_2$ layer with a thickness of 5 nm is deposited, which is used as a heterogeneous seed layer, and then the heterogeneous seed layer is etched to form heterogeneous seed crystals. Then, an amorphous silicon layer with a thickness of 100 nm is formed by plasma enhanced chemical vapor deposition, and then a part of the amorphous silicon layer on the thermal conductor layer 3 and the heterogeneous seed crystals is removed by etching, but another part of the amorphous silicon layer between the strips is reserved. Finally, the amorphous silicon layer is irradiated by an excimer laser or a solid-state laser to recrystallize the amorphous silicon layer, so as to obtain the polycrystalline silicon film. In this embodiment, because a melting point of tungsten is very high, a range of laser irradiation may cover the amorphous silicon layer and a region of tungsten.

In another preferred embodiment of the present disclosure, aluminum is used as the thermal conductor. Because a melting point of aluminum is low, in order to prevent aluminum from being melted during laser irradiation, the range of laser irradiation needs to be confined, and at this time, a homogeneous seed layer may be used, i.e., the polycrystalline silicon seed crystals as the nucleation of the amorphous silicon layer. Particularly, the laser irradiation is applied to a part of the amorphous silicon layer between the strips, but not applied to surfaces of the aluminum thermal conductor layer and the polycrystalline silicon seed crystals.

Figure 9:
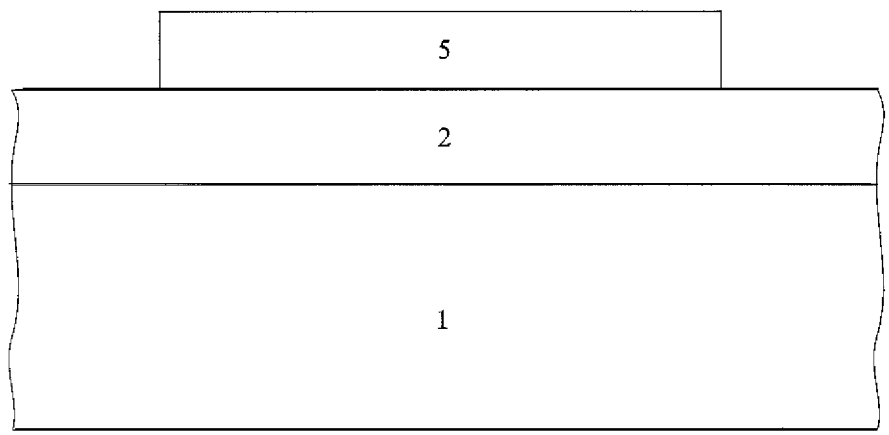
FIG. 9 is a cross-sectional view of an active region for a thin film transistor after removing a thermal conductor layer and seed crystals by etching according to an embodiment of the present disclosure.
Figure 10:
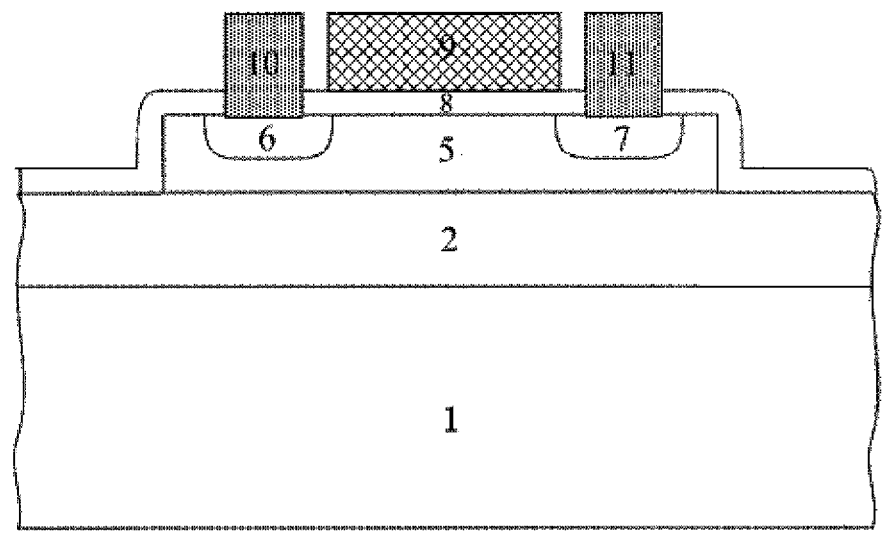
FIG. 10 is a cross-sectional view of a thin film transistor according to a preferred embodiment of the present disclosure.

A thin film transistor may be provided by processing the polycrystalline film according to an embodiment of the present disclosure. In one preferred embodiment of the present disclosure, the thermal conductor layer and the heterogeneous seed crystals are removed by etching, only the polycrystalline layer is reserved to be used as an active region, and a direction vertical to the thermal conductor layer is used as a channel direction, as shown in FIG. 9. The polycrystalline layer 5 is doped by ion implantation to form a source 6 and a drain 7, a gate dielectric layer 8 is deposited on the polycrystalline layer 5, a gate 9 is formed on the gate dielectric layer 8, a source metal layer 10 is formed on the source 6, and a drain metal layer 11 is formed on the drain 7, so as to obtain a thin film transistor, as shown in FIG. 10. In other preferred embodiments of the present disclosure, the thermal conductor layer and the heterogeneous seed crystals do not need to be removed, and the polycrystalline layer 5 may be directly doped by ion implantation to form the source 6 and the drain 7, the gate dielectric layer 8 is deposited on the polycrystalline layer 5, the gate 9 is formed on the gate dielectric layer 8, the source metal layer 10 is formed on the source 6, and the drain metal layer 11 is formed on the drain 7, so as to obtain the thin film transistor.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A method for forming a polycrystalline film, comprising steps of:
   providing a substrate;
   forming a thermal conductor layer on the substrate;
   etching the thermal conductor layer until the substrate is exposed to form a thermal conductor pattern;
   forming a seed layer on the thermal conductor layer and the substrate;
   etching the seed layer to form seed crystals on both sidewalls of the thermal conductor layer;
   forming an amorphous layer on the substrate, the thermal conductor layer and the seed crystals;
   etching the amorphous layer; and
   recrystallizing the amorphous layer to form a polycrystalline layer.

2. The method according to claim 1, further comprising:
   forming a passivation layer on the substrate, wherein the thermal conductor layer is formed on the passivation layer.

3. The method according to claim 1, wherein a material of the substrate is one of glass, plastics and silicon.

4. The method according to claim 2, wherein a material of the passivation layer is an oxide of silicon, silicon nitride, silicon carbide or a combination thereof.

5. The method according to claim 1, wherein a melting point of a thermal conductor of the thermal conductor layer is higher than a highest temperature of the thermal conductor layer during laser irradiation, the thermal conductor is a metal or a high temperature-resistant non-metallic material, and a thermal conductivity of the thermal conductor layer is higher than that of the polycrystalline layer.

6. The method according to claim 1, wherein the seed layer is a heterogeneous seed layer or a homogeneous seed layer, and a mismatch between a lattice constant of a material of the seed layer and N or 1/N times of the lattice constant of a material of the polycrystalline layer is not more than 30%, in which N is a positive integer.

7. The method according to claim 6, wherein a material of the heterogeneous seed layer is one of a metal silicide, a metal germanide, calcium fluoride, cerium oxide and zirconium oxide.

8. The method according to claim 1, wherein the recrystallizing step is performed by laser irradiation or rapid thermal processing.

9. A polycrystalline film, comprising:
   a substrate;
   a thermal conductor layer formed on the substrate;
   seed crystals formed on both sidewalls of the thermal conductor layer;
   a polycrystalline layer formed on a part of the substrate which is not covered by the thermal conductor layer and the seed crystals.

10. The polycrystalline film according to claim 9, further comprising:
    a passivation layer formed on the substrate, wherein the thermal conductor layer is formed on the passivation layer, and the polycrystalline layer formed on a part of the passivation layer which is not covered by the thermal conductor layer and the seed crystals.

11. The polycrystalline film according to claim 9, wherein a material of the substrate is one of glass, plastics and silicon.

12. The polycrystalline film according to claim 10, wherein a material of the passivation layer is an oxide of silicon, silicon nitride, silicon carbide or a combination thereof.

13. The polycrystalline film according to claim 9, wherein a thermal conductor of the thermal conductor layer is a metal or a high temperature-resistant non-metallic material, and a thermal conductivity of the thermal conductor layer is higher than that of the polycrystalline layer.

14. The polycrystalline film according to claim 9, wherein the seed crystals are heterogeneous seed crystals or homogeneous seed crystals, and a mismatch between a lattice constant of a material of the seed crystals and N or 1/N times of the lattice constant of a material of the polycrystalline layer is not more than 30%, in which N is a positive integer.

15. The polycrystalline film according to claim 14, wherein a material of the heterogeneous seed crystals is one of a metal silicide, a metal germanide, calcium fluoride, cerium oxide and zirconium oxide.

16. A thin film transistor, comprising:
a substrate;
a thermal conductor layer formed on the substrate;
seed crystals formed on both sidewalls of the thermal conductor layer;
a polycrystalline layer formed on a part of the substrate which is not covered by the thermal conductor layer and the seed crystals;
a source and a drain formed in the polycrystalline layer respectively;
a gate dielectric layer formed on the polycrystalline layer and a gate formed on the gate dielectric layer; and
a source metal layer formed on the source and a drain metal layer formed on the drain.

17. The thin film transistor according to claim 16, further comprising:
a passivation layer formed on the substrate, wherein the thermal conductor layer is formed on the passivation layer, and the polycrystalline layer formed on a part of the passivation layer which is not covered by the thermal conductor layer and the seed crystals.

18. The thin film transistor according to claim 16, wherein a thermal conductor of the thermal conductor layer is a metal or a high temperature-resistant non-metallic material, and a thermal conductivity of the thermal conductor layer is higher than that of the polycrystalline layer.

19. The thin film transistor according to claim 16, wherein the seed crystals are heterogeneous seed crystals or homogeneous seed crystals, and a mismatch between a lattice constant of a material of the seed crystals and N or 1/N times of the lattice constant of a material of the polycrystalline layer is not more than 30%, in which N is a positive integer.

* * * * *